United States Patent [19]

Liang et al.

[11] Patent Number: 5,665,623

[45] Date of Patent: Sep. 9, 1997

[54] METHOD OF FABRICATING TOTALLY SELF-ALIGNED CONTACTS FOR DYNAMIC RANDOM ACCESS MEMORY CELLS

[75] Inventors: George Wen Jya Liang, Hsinchu; Chan-Jen Kno, Tainan; Chao-Ming Koh, Taipei, all of Taiwan

[73] Assignee: Vanguard International Semiconductor Corporation, Hsin-Chu, Taiwan

[21] Appl. No.: 578,925

[22] Filed: Dec. 27, 1995

[51] Int. Cl.$^6$ ............................................. H01L 21/8242
[52] U.S. Cl. ................................. 438/239; 148/DIG. 20; 438/297; 438/453; 438/666
[58] Field of Search ..................... 437/228, 52, 195; 148/DIG. 20

[56] References Cited

U.S. PATENT DOCUMENTS

| | | | |
|---|---|---|---|
| 5,275,974 | 1/1994 | Ellul et al. | 437/203 |
| 5,376,577 | 12/1994 | Roberts et al. | 437/52 |
| 5,393,704 | 2/1995 | Huang et al. | 437/41 |
| 5,521,113 | 5/1996 | Hsue et al. | 437/52 |

OTHER PUBLICATIONS

"Processes of the Future" Solid State Technology, pp. 42–54, Feb. 1995.

*Primary Examiner*—Jey Tsai
*Attorney, Agent, or Firm*—George O. Saile

[57] ABSTRACT

A method is provided for fabricating totally self-aligned contacts on semiconductor substrates. The method is particularly applicable to dynamic random access memory for reducing the cell area. The method involves patterning the silicon nitride layer for the local oxidation of silicon (LOCOS) process to provide wide device areas for the gate electrode of the FETs, and narrow device areas adjacent and contiguous to the wide device areas on and in which are formed portions of the source/drain areas and the totally self-aligned contacts. The lateral encroachment of the field oxide (bird's beak) into the narrow device areas during the LOCOS process reduce the width of the area to about 0.20 um, and thereby extend the resolution limit of the current lithography (about 0.40 um) used to define the nitride layer. Non-critically aligned contact openings etched in an insulating over the narrow device areas, and extending over the field oxide region (bird's beak) and over the insulated gate electrodes result in totally self-aligned contacts defined by the bird's beak structures and gate electrodes.

22 Claims, 7 Drawing Sheets

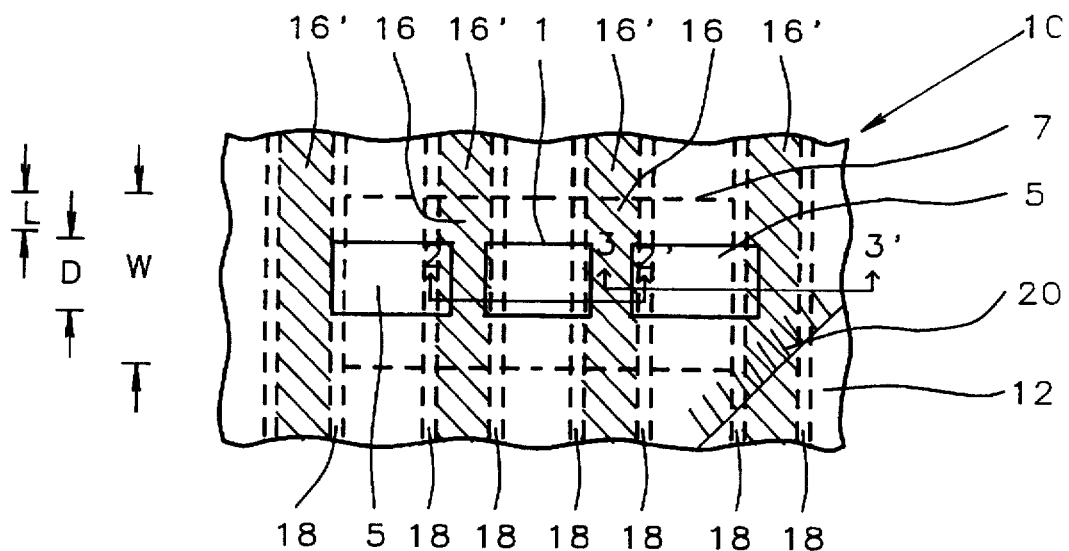
FIG. 1 - Prior Art
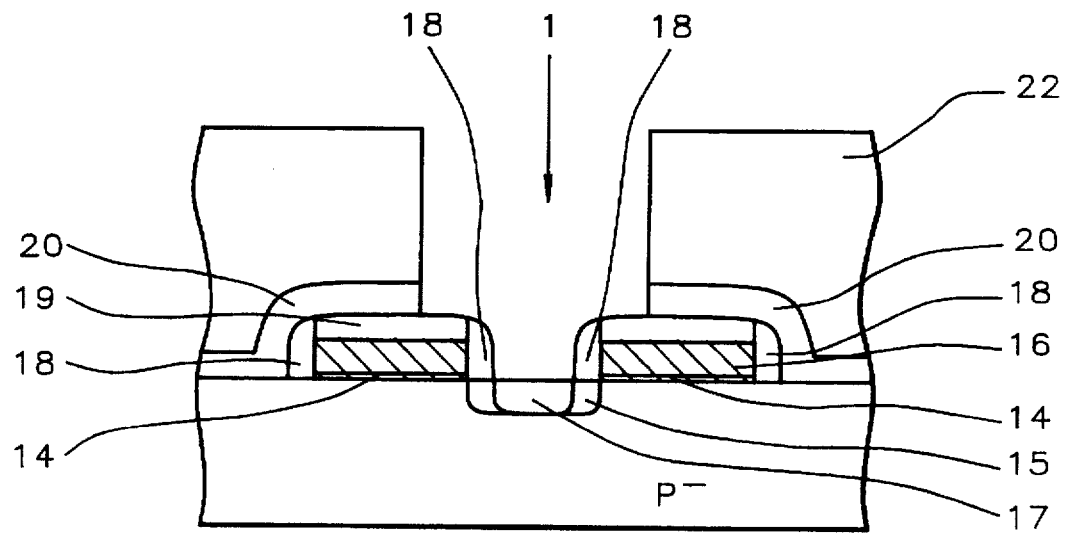
FIG. 2 - Prior Art

METHOD OF FABRICATING TOTALLY SELF-ALIGNED CONTACTS FOR DYNAMIC RANDOMACCESS MEMORY CELLS

BACKGROUND OF THE INVENTION (1) Field of the Invention

This invention relates to semiconductor integrated circuits, and more particularly, to a method for fabricating totally self-aligned contacts on integrated circuits, and more specifically on dynamic random access memory circuits.

(2) Description of the Prior Art

There is a continuing effort in the semiconductor industry to increase the circuit density on semiconductor chips to improve the performance and reduce the cost. The increase in performance is partly due to improved high resolution optical lithography and the directional etching achieved in plasma etchers. Another method of increasing the device density on a chip in conjunction with the improved lithography and plasma etching is to employ self-aligning techniques that reduce the alignment tolerance during mask alignment on the chip.

The dynamic random access memory (DRAM) circuit is one type of integrated circuit chip that is experiencing this increase in circuit density. The DRAM chip is composed, in part, of an array of memory cells. Each cell is formed from a single pass transistor, typically a field effect transistor (FET), and a storage capacitor. The storage capacitor makes contact to one of the two source/drain areas of the FET and a bit line makes contact to the other source/drain area of each of the transistors. The number of memory cells on the DRAM chip are expected to reach 1 Gigabits while the minimum feature sizes within the cell are expected to be less than 0.20 micrometers (um) by the year 2001, as projected by the Semiconductor Industry Association's technology roadmap as reviewed in the article "Processes of the Future", Solid State Technology, pages 42–54, February 1995.

If these goals are to be achieved, the DRAM cell must be further reduced in size, and the bit line and node contacts to the FET source/drain areas on the substrate must also be correspondingly reduced in size and have a more accurately alignment tolerances. To better understand the nature of the problem in reducing the cell size, a typical prior art DRAM cell partially completed is shown schematically in elevational view in FIG. 1, and described in detail. Cross sections through the cell area are also shown in FIGS. 2 and 3. The partially completed DRAM cell structure in FIG. 1 is shown having a bit line contact 1 that is common to two adjacent capacitor node contacts 5 with gate electrodes 16 between the bit line contacts and node contacts.

Starting with FIG. 1, the typical prior art DRAM cells are formed on a semiconductor substrate 10, usually composed of a P⁻ doped single crystalline silicon. A relatively thick Field OXide (FOX) 12 is formed on and in portions of the substrate surface surrounding and electrically isolating active devices areas 7, as shown in FIG. 1. The field oxide 12 is usually formed by the LOCal Oxidation of Silicon (LOCOS) method commonly practiced in the semiconductor industry. The LOCOS process consists of depositing or thermally growing a thin pad oxide composed of silicon oxide on the substrate surface and then depositing a silicon nitride ($Si_3N_4$) layer, usually by chemical vapor deposition (CVD), the nitride layer serving as a barrier to thermal oxidation. The silicon nitride layer is patterned leaving portions over the silicon substrate where active device regions are required semiconductor devices, such as field effect transistors. The silicon substrate is then subjected to an oxidizing ambient, such as steam oxidation, to form the relatively thick field oxide regions 12 composed of silicon oxide ($SiO_2$) surrounding the active device areas 7. A portion of the field oxide also naturally forms under the perimeter of the nitride layer by the lateral oxidation of the silicon substrate and is commonly referred to, in the industry, as the "bird's beak" because of its shape. After removing the silicon nitride layer, for example in a hot phosphoric acid solution, and the pad oxide in a dilute solution of hydrofluoric acid (HF), a FET gate oxide is formed on the device areas 7 using a thermal oxidation. Polysilicon gate electrodes 16 and the interconnecting word lines 16' are then formed by patterning a polysilicon layer, as shown in FIG. 1. The gate electrodes 16 and word lines are usually heavily doped with an N type electrically conductive dopant, such as phosphorus (P) or arsenic (As) to provide low resistance. It is also common practice in the semiconductor industry to provide a first insulating layer (not shown in FIG. 1) over the gate electrodes and word lines, that is usually patterned at the same time as the electrodes and word lines. This first insulating layer or oxide cap layer serves as an etch stop layer when the self-aligned contacts that extend over the gate electrodes are etched in a second insulating layer. After forming the gate electrodes 16, lightly N-type doped source/drain regions are formed in the active device areas 7, for example by ion implantation, adjacent to the gate electrodes 16, and then a blanket sidewall insulating layer is deposited and anisotropically etched back forming sidewall spacers 18 on the sidewalls of the gate electrodes 16. This essentially completes the field effect transistors (FETs). A second insulating layer 20 is blanket deposited over the substrate surface, and contact openings are etched in layer 20 to the source/drain regions to form the bit line contacts 1. If the node contacts and storage capacitors are to be formed first, then the node contacts 5 are etched to the source/drain areas, also as depicted in FIG. 1. The cross section 3–3' through the node contact 5 in FIG. 1 is shown in cross sectional view in FIG. 3. Also shown in FIG. 3 is the gate oxide 14 under the gate electrode 16, the LDD source/drain areas 15 adjacent to the gate electrode, and the heavily doped source/drain area 17. If the bit line contact 1 is etched first, then the cross section 2–2' through the bit contact 1 region in FIG. 1 is as shown in cross sectional view in FIG. 2. The gate oxide 14, LDD regions 15 and source /drain area 17 are also depicted, as shown in FIGS. 3. The contact openings 1 and 5, are formed by anisotropic etching using a patterned photoresist layer 22 etching mask, as shown in FIG. 2 and 3. As is commonly practiced in the semiconductor industry the contact openings are etched in layer 20 to the cap oxide 19 over the gate electrodes 16 so as to provide a self-aligned contact to the gate electrode adjacent to the sidewalls 18. The width W of the contact openings in photoresist masking layer 20 are aligned within the active device areas 7 having an alignment spacing L sufficient to prevent the contact from partially or completely lying outside the active device area 7, as shown in FIG. 1.

Unfortunately, a number of process limitations occur when the active device area is reduced in size to provide for the increase in DRAM cell density. To provide reliable memory cells having repeatable electrical characteristics it is necessary that the node or bit line contacts 1 and 5 lie completely within the source/drain areas (active device areas 7 in FIG. 1). However, because of the resolution limitations of the lithography there is an increased risk factor that the contacts will lie outside the source/drain area. For example, the current lithographic limitations on feature size is about 0.4 micrometers (um), and the alignment tolerance is about 0.2 um. Therefore, if the width W of the active device areas 7 in FIG. 1 is reduced from 1.0 um to 0.6 um to improve the cell pitch, and the alignment tolerance L (in FIG. 1) is maintained at a value of at least 0.2 um the width D of the contact openings 1 or 5 would have to be only about 0.2 um in width which is less than the lithographic resolution limits. On the other hand, if the contact width D is sufficiently large (0.4 nm) to satisfy the lithograph resolution limits, then the alignment tolerance (about 0.1 um) is insufficient for the contacts to lie completely within the active device area. The width of the device area W is also limited to a value of at least 0.6 um in order to provide a sufficient wide FET channel length to provide the required current driving capability for the pass transistor (FET).

Therefore there is still a strong need in the semiconductor industry for making reliable DRAM circuits with reduced cell size by methods that extend the current lithographic limits.

SUMMARY OF THE INVENTION

The above disadvantages in the prior art are over come by the method of this present invention. The improvements are achieved in accordance with the following objectives.

It is a principal object of this invention to provide totally self-aligned contacts to the source/drain areas of field effect transistors (FETs), the width of the contact being less than the minimum feature size of the current photolithographic resolution.

It is another object of this invention to provide a method for forming totally self-aligned contacts that eliminate the need for a critical alignment tolerances for the contact openings to the source/drain areas of field effect transistors.

It is another object of the present invention to fabricate these totally self-aligned contacts utilizing the lateral oxidation (bird's beak) that results when the field oxide regions are formed by the method of local oxidation of silicon (LOCOS).

It is still another object of the invention to provide these totally self-aligned contacts using a cost effective manufacturing process having good reliability.

This invention begins by providing a semiconductor substrate, typically composed of a P⁻ conductive type single crystal silicon. A pad oxide layer composed of silicon oxide ($SiO_2$) and then a silicon nitride ($Si_3N_4$) layer, providing a barrier to oxidation, is deposited on the silicon substrate. The silicon nitride layer is then patterned by conventional photoresist masking and plasma etching leaving portions of the nitride layer over the planned device areas. The substrate is then exposed to an oxidizing ambient at an elevated temperature to form a field oxide region that surrounds and electrically isolates the device areas. This method is commonly referred to as the LOCal Oxidation of Silicon (LOCOS) in the semiconductor industry. In this invention the silicon nitride layer is uniquely patterned to provide a silicon nitride layer having wide portions and narrow portions in each of the device areas. After forming the field oxide by the LOCOS method, the patterned silicon nitride layer is removed resulting in device areas having corresponding wide and narrow regions. During the formation of the relatively thick field oxide, lateral oxidation under the silicon nitride results in a bird's beak type structure (also composed of silicon oxide) extending into and further reducing the device areas. After the nitride and pad oxide layers are removed, a thin gate oxide is formed on the device areas for the FETs. Next, a polysilicon layer doped N-type, such as with arsenic or phosphorus, and having a cap oxide formed on the polysilicon surface by depositing a first insulating layer, is patterned by conventional photolithographic techniques and anisotropic plasma etching to form the gate electrodes for the FETs over the wide regions of the device area. The wide regions of the device area are designed so as to provide a gate electrode having a channel width with sufficient current driving capability. The channel width is typically 0.6 micrometers (mu) or wider for a DRAM cell. The narrow region of the device area, formed by the method of this invention and utilized for forming the totally self-aligned contacts, are designed to have widths that are near the resolution limits of the current photolithographic technology, and is currently in the range of about 0.35 to 0.40 micrometers. However, as will be apparent shortly, the design rules for the minimum width of the device areas can be relaxed considerably while still providing very small contacts. The thickness of the field oxide is now chosen so that the encroachment of the field oxide bird's beak is between about 0.14 to 0.16 um. This results in a reduced width of the narrow regions of the device area to about 0.08 to 0.12 um which is well below the current lithography resolution (0.40 um). Source/drain areas are formed next by implanting an N type dopant, such as arsenic ($As^{75}$) or phosphorus ($p^{31}$) adjacent to the gate electrodes and in the narrow portions of the device areas. The gate electrode and the field oxide regions serve as a self-aligning mask for the implant to the FET structure. Sidewall spacers are now formed on the sidewalls of the gate electrodes of the FET by depositing a conformal sidewall insulating layer and anisotropically etching back the layer. A second insulating layer is deposited over the FET structure, for example, by chemical vapor deposition, and contact openings are etched over and to the source/drain areas in the narrow regions of the device areas. The contact openings are made larger than the device areas and therefore extend over the bird's beak portion of the field oxide layer and also extend over a portion of the gate electrodes. The contact opening over the gate electrode is opened to the cap oxide. During the etching of the contact openings the field oxide (bird's beak region) is also further recessed by over etched to remove about 0.04 to 0.06 um of the field oxide, thereby increasing the contact width to about 0.16 to 0.22 um. This completes the formation of the totally self-aligned contact having a very small feature size.

There are several significant advantages in making these totally self-aligned contacts by the method of this invention rather than using the conventional lithography defined contact. The contact can be formed having feature sizes (0.20 um) that are considerably less than the current lithographic resolution of about 0.4 um, that is not expected to be achieved until the year 2001 to 2004. See the above cited reference in Solid State Technology, February 1995, page 42. Another key feature of the invention is the non-critical alignment of the contact opening in the second insulating layer to within the source/drain area, since the contact is self-aligned to the edge of the field oxide on three sides of the source/drain contact and the gate electrode on the fourth side. This provides a self-aligned contact that would be otherwise difficult to achieve using conventional lithographic exposure equipment.

The totally self-aligned contact of this invention is further improved by forming a "dog bone" shaped silicon nitride layer over the planned contact area prior to the performing the LOCOS process. This essentially eliminates an enhanced bird's beak encroachment that naturally occurs at the exterior corners of a patterned silicon nitride layer during the field oxidation step and further improves the contact shape.

BRIEF DESCRIPTION OF THE DRAWINGS

The objects and advantages of this invention are best understood by the following embodiments with reference to the attached drawings which include:

FIG. 1 depicts in a elevational schematic view a typical prior art DRAM cell having the capacitor node contacts 5 and bit line contacts 1 aligned within the device area 7.

FIGS. 2 and 3 depict in cross sectional schematic view a typical bit line contact 1 through section 2–2' in FIG. 1 and a node contact 5, through section 3–3' in FIG. 1, respectively.

DESCRIPTION OF THE PREFERRED EMBODIMENTS

Now in keeping with the objects of this invention, the method for forming the totally self-aligned contacts is described in detail. Although the method is described in detail for storage capacitor node contacts on a dynamic random access memory (DRAM) cells, it should also be well understood by one skilled in the art that the method can also be used for forming totally self-aligned bit line contacts on the DRAM cell, and can be used in general to form these type of contacts on other FETs fabricated on the semiconductor substrate. And it should be further understood by those skilled in the art that by including additional processing steps both N-channel and P-channel FETs can be provided on the semiconductor substrate having both totally self-aligned contacts, by the method of this invention, and also conventional contacts from which can be formed Complementary Metal-Oxide-Semiconductor (CMOS) circuits.

Figure 4:
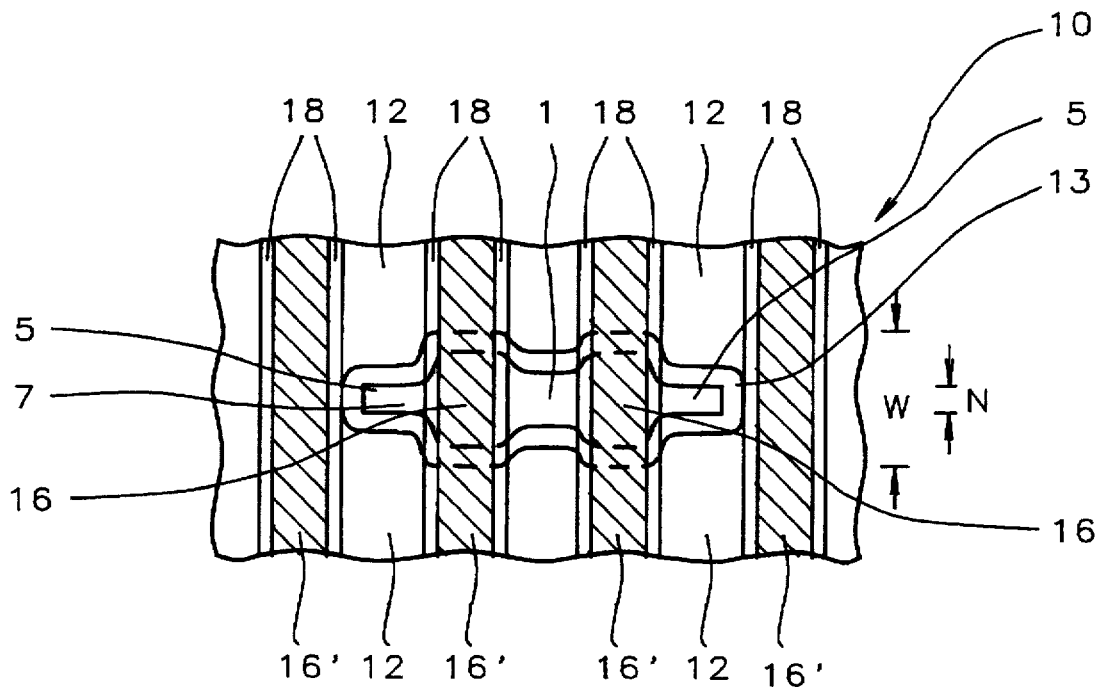
FIG. 4. is a schematic elevational view of a portion of a DRAM chip of this invention. Shown is the totally self-aligned bit line contact 1 that is common to the two FET gate electrodes 16 having capacitor node totally self-aligned contacts 5. The contacts are self-aligned to the bird's beak region 13 of the field oxide 12.

Referring now to FIG. 4, a schematic elevational view is shown of a portion of a partially completed DRAM chip on a substrate 10. The portion of the DRAM chip consist of two storage cells having capacitor node contacts 5, a common bit line contact 1, and two FET gate electrodes 16 interposed between the node and bit line contacts. The DRAM cells are fabricated using the LOCOS process to form a field oxide region 12 while leaving electrically isolated device areas 7 having wide and narrow areas, by the method of this invention. Also shown in FIG. 4 is the bird's beak portion 13 of the field oxide 12 extending into the device area 7. FET gate electrodes 16 are formed from a patterned polysilicon layer on the wide device areas, the width of which is indicated by W in FIG. 4. The patterned polysilicon layer also serves as the interconnecting word lines 16' over the field oxide regions 12. The narrow regions of the device area 7, having a width N as indicated in FIG. 4, is used, by the method of this intention, for forming the totally self-aligned capacitor node contacts 5 and the totally self-aligned bit line contact 1. It should be understood that although both self-aligned bit line and node contacts are defined concurrently by the surrounding field oxide bird's beak structure and gate electrodes, the contact opening to the bit line and node contacts are usually made at different steps in the process. To simplify the discussion only the process for forming the totally self-aligned contact for the storage node capacitors is described.

Figure 5:
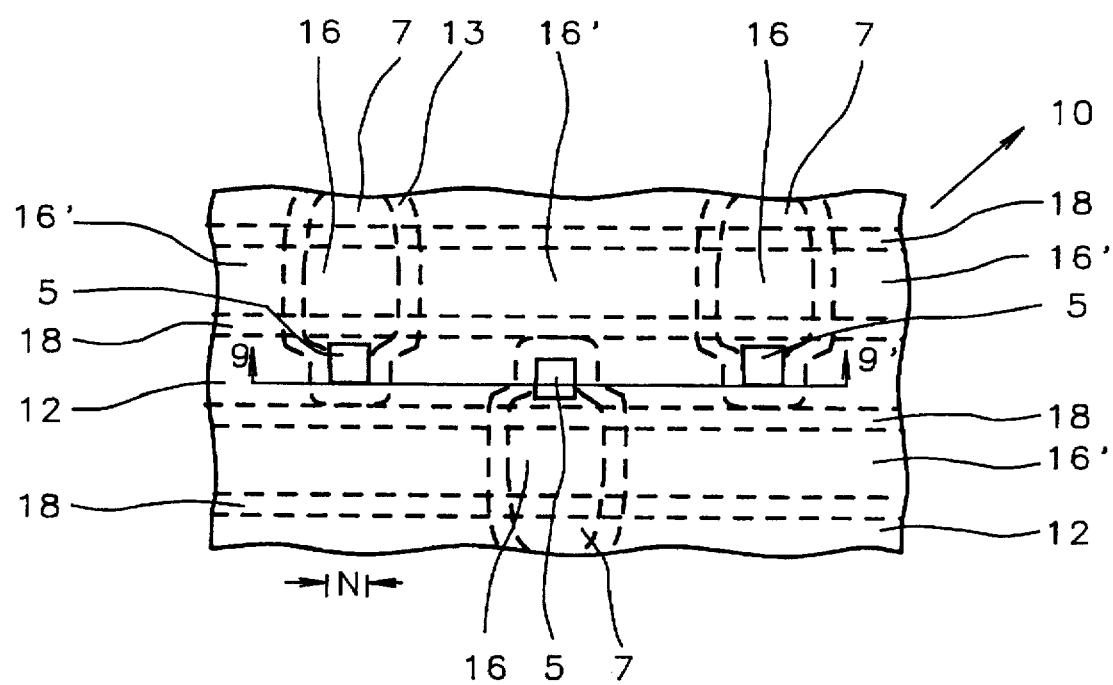
FIG. 5 is a schematic elevational view of a portion of a DRAM chip of this invention (rotated by 90 degrees with respect to FIG. 4) showing three adjacent capacitor node contacts 5, but do not include the common bit line contact and second node contact as in FIG. 4.

Referring now to FIG. 5, a second elevational view is shown of a portion of a partially completed DRAM chip having an orientation of 90 degrees with respect to the view in FIG. 4, The portion of the DRAM chip shown in FIG. 5 consist of three adjacent capacitor node contacts 5 and two of the word line 16'. The portions Of the word line 16' that extend over the device areas 7 form the three gate electrodes 16 for the pass transistor (FET) in each of the cell areas. Not shown (out of view in FIG. 5) is the common bit line contact and second node contact that is associated with each of the device areas, which were previously described and depicted in FIG. 4. The cross section through the region 9–9' (FIG. 5) is for the cross section shown in FIG. 9, and the sequence of cross sections in FIGS. 6 through 10 is for the sequence of process steps that is used to fabricate the totally self-aligned node contacts.

The detailed process for making the totally self-aligned node contacts is now described with reference to the series of cross sections shown in FIG. 6 through 10, and the elevational view of FIG. 5.

Figure 6:
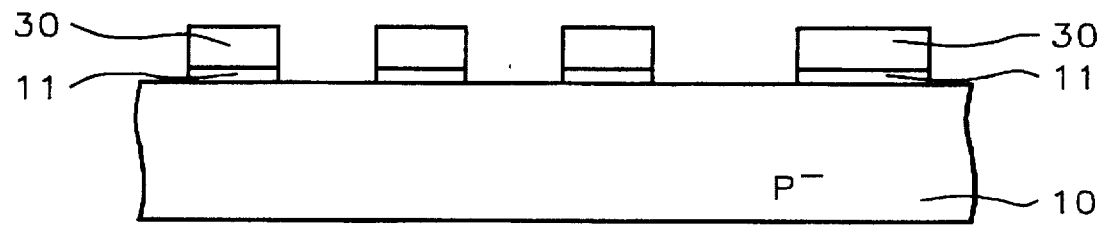
FIGS. 6 through 10 show in schematic cross sectional view the process sequence for making the totally self-aligned contact for the capacitor node contacts. The cross sectional view in FIG. 9 is for the region 9–9' in the elevational view of FIG. 5.

Referring now to FIG. 6, the process begins by providing a semiconductor substrate 10. The preferred substrate is typically composed of a lightly P-type single crystalline silicon having a <100> crystallographic orientation. A relatively thin stress-relief thermal silicon oxide ($SiO_2$) layer 11 is formed on the substrate surface, commonly referred to as a pad oxide. This LOCOS pad oxide 11 is preferably between about 50 to 400 Angstroms thick, and is usually formed by thermal oxidation in an oxidizing ambient containing dry oxygen and at a temperature of between about 850° to 1000° C. A silicon nitride ($Si_3N_4$) layer 30 which provides a barrier to oxidation is then deposited on the pad oxide 11, and is patterned, as shown in FIG. 6. removing the nitride layer 30 over areas where the field oxide is required, and leaving portions over the planned device areas 7, as shown in FIG. 5 which also includes the narrow regions of the device areas that will later form the totally self-aligned node contacts 5 for the DRAM cells. The silicon nitride is typically deposited at a high temperature (700°–800° C.) using low pressure chemical vapor deposition (LPCVD). Preferably the LPCVD can be carried out in a reaction furnace using a gas mixture containing silane $SiH_4$) and ammonia ($NH_3$) or alternatively, dichlorosilane ($SiCl_2H_2$) and ammonia can be used. The preferred thickness of the silicon nitride layer is between about 1000 to 3000 Angstroms.

After patterning the Silicon nitride layer 30 using conventional photolithographic techniques and anisotropic plasma etching, the substrate 10 is then subjected to an oxidizing ambient to form the relatively thick Field OXide (FOX) 12 in the exposed regions on the substrate surface 10, as shown in FIGS. 4 and 5. For example, the field oxidation can be carried out in thermal oxidation furnace at a temperature of between about 950° to 1150° C., and in an oxidizing ambient such as a water vapor ($H_2O$). The preferred thickness of the field oxide 12 is between about 3000 to 7000 Angstroms.

Figure 7:
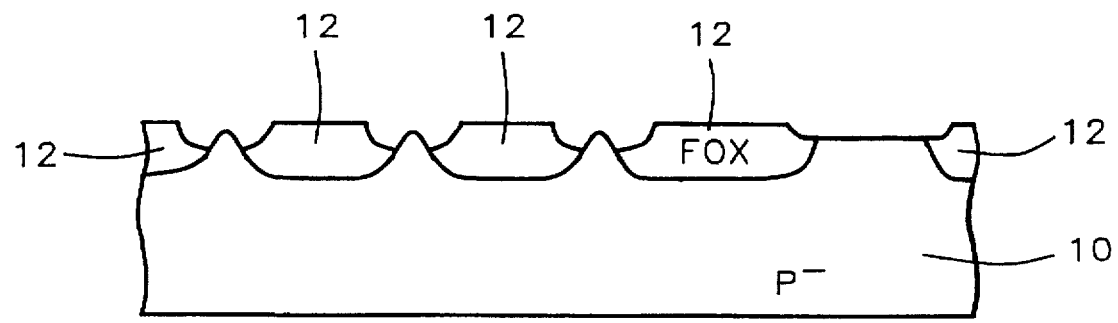
Figure 16:
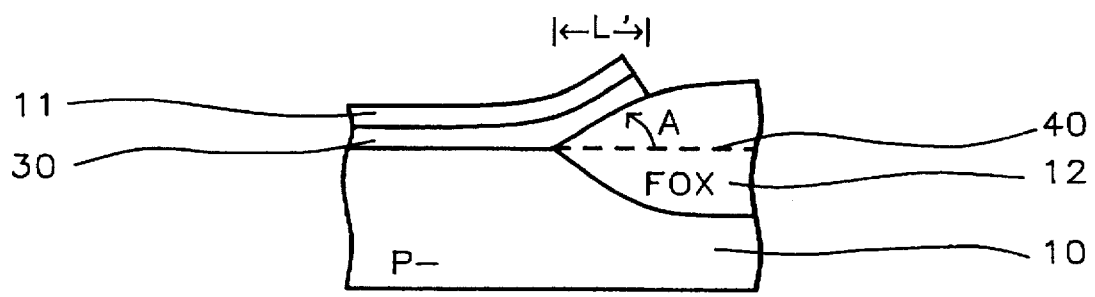
FIG. 16 shows a schematic cross section the reduced encroachment of the bird's beak for the dog bone shaped silicon nitride layer.

Referring next to FIG. 7, after forming the patterned field oxide 12, the silicon nitride layer 30 and the pad oxide 11 (FIG. 6) are removed. The silicon nitride layer 30 is typically removed using a hot phosphoric acid etch solution and the pad oxide is removed by etching in a dilute solution of hydrofluoric acid (HF). The cross section in FIG. 7 is shown for the narrow regions of the device areas, which is indicated as 9–9' in FIG. 5. The thickness of this field oxide layer 12 is critical to the invention because the bird's beak that forms laterally under the edge of the silicon-nitride mask determines the size of the totally self-aligned contacts (width N in FIGS. 4 and 5). To better understand the invention reference is made to FIG. 16, which shows an enlarged view of the field oxide 12, with the nitride layer 30 and pad oxide still on the silicon substrate 10. Typically during the field oxidation of the silicon, the field oxide 12 is formed partially below and partially above the surface of the silicon substrate 10, as indicated by the dashed line 40 in FIG. 16. The bird's beak portion of the field oxide is also shown extending under the silicon nitride layer 30 by a distance of L', as shown in FIG. 16. The angle A, which is typically 45 degrees, and the thickness of the field oxide 12 determine the encroachment L' of the birds beak into the active device area under the nitride layer 30. By way of example, if the width N of the silicon nitride layer 30 (FIG. 5) is the current photolithography resolution limitation of about 0.40 micrometers (um) and the field oxide is grown to a thickness of 0.30 um, then the bird's beak length L' is 0.15 um. Therefore, in this example, the totally self-aligned contacts 5 in FIG. 5, and shown in cross section in FIG. 7 are reduced in width to 0.10 um by the encroachment of the bird's beak. This contact far exceeds the current photolithography resolution, and indeed is not expected to be achieved by purely lithographic means until the year 2007.

Figure 3:
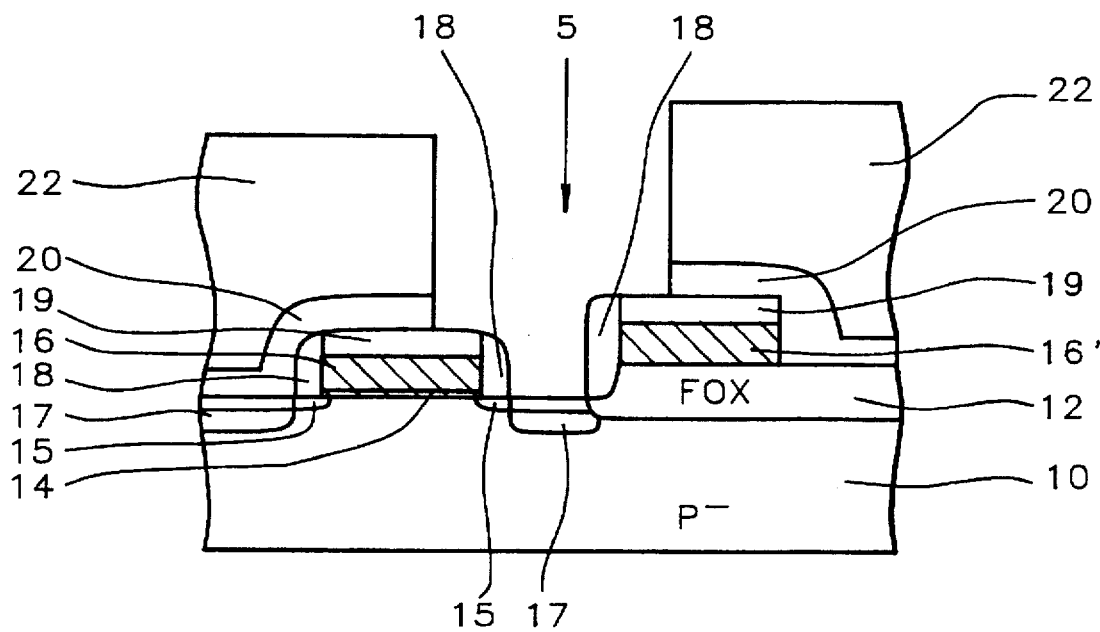

After the field oxide 12 is grown by the LOCOS method and the silicon nitride layer 30 and pad oxide layer are removed, field effect transistors (FETs) are formed on the device areas 7 (FIG. 5). The method consists of thermally growing a gate oxide (not shown) on the device areas 7 having a thickness of between about 50 to 150 Angstroms. The gate electrodes 16 are next formed on the device areas 7, and word lines 16' are formed on the field oxide areas (FIG. 5). Typically the gate electrodes 16 and bit lines 16' are formed by depositing a LPCVD polysilicon layer having a thickness of between about 1000 to 3000 Angstroms, and then the layer is doped with an $N^+$ type conductive dopant, such as arsenic or phosphorus, by ion implantation or, alternatively by in situ doped during the LPCVD polysilicon deposition. A first insulating layer 19 (see FIGS. 2 and 3), preferably composed of silicon oxide is deposited on the polysilicon layer to form the cap oxide, and then both are patterned by conventional photolithographic means and anisotropic plasma etching to form the gate electrodes 16 and word lines 16' with the cap oxide 19, as shown in FIG. 3. The first insulating layer (cap oxide) 19 is between about 1000 to 2000 Angstroms thick. The exposed device areas 7 adjacent to the gate electrodes 16 and contact regions 5 which are self-aligned to the field oxide (bird's beak) are lightly doped. $N^-$ to form the lightly doped source/drain regions of the FETs. A sidewall insulating layer is deposited, such as a CVD silicon oxide and etched back anisotropically to form the sidewall spacers 18, as shown in FIGS. 4 and 5.

Figure 8:
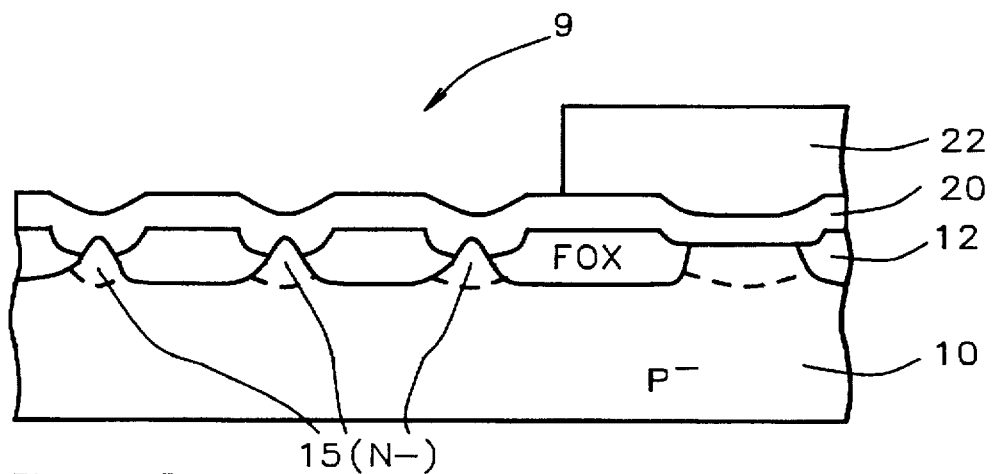

The method of this invention now continues by depositing a second insulating layer 20, as shown in FIG. 8. Layer 20 is preferably composed of a silicon oxide, and is deposited in a LPCVD reactor by the decomposition of, for example, tetraethosiloxane (TEOS) at a temperature in the range of between about 650° to 800° C. The preferred thickness of layer 20 is between about 900 to 1200 Angstroms, and more specifically having a thickness of 1000 Angstroms. A photoresist masking layer 22 is now patterned over layer 20, as shown in FIG. 8, to form the contact openings 9 over the totally self-aligned contacts 5 that were previously formed. The contact openings 9, are anisotropically plasma etched using a high plasma density etcher or Reactive Ion Etching (RIE) and an etching gas mixture, such as carbon tetrafluoride ($CF_4$) and a carrier gas, such as argon (Ar).

Figure 9:
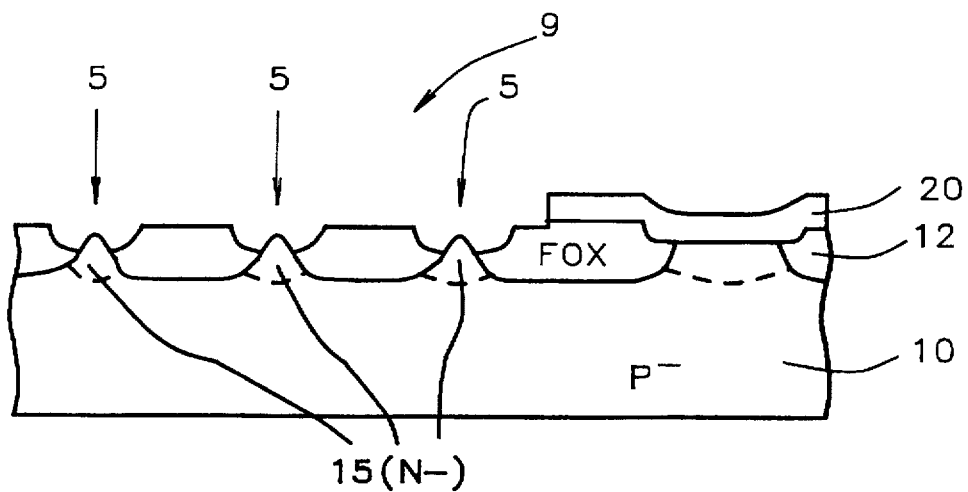
Figure 11:
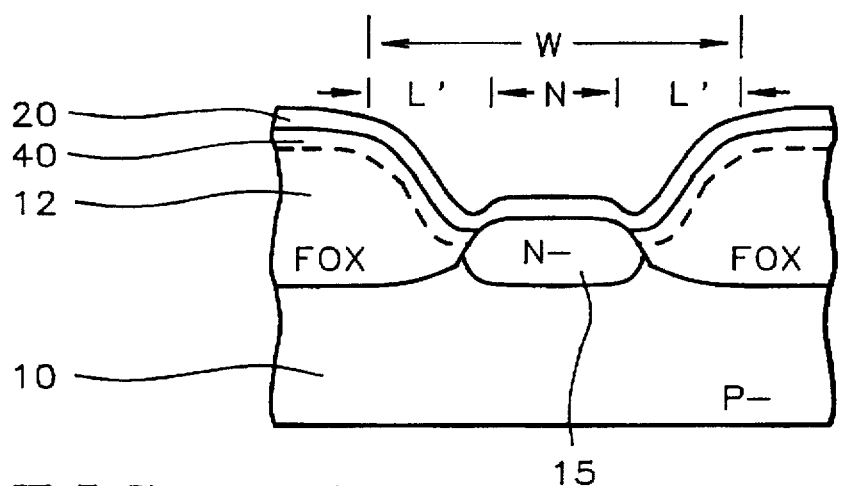
FIGS. 11 and 12 are enlarged cross sectional views of one of the totally self-aligned contacts shown after the process Steps in FIG. 8. and 9, respectively.
Figure 12:
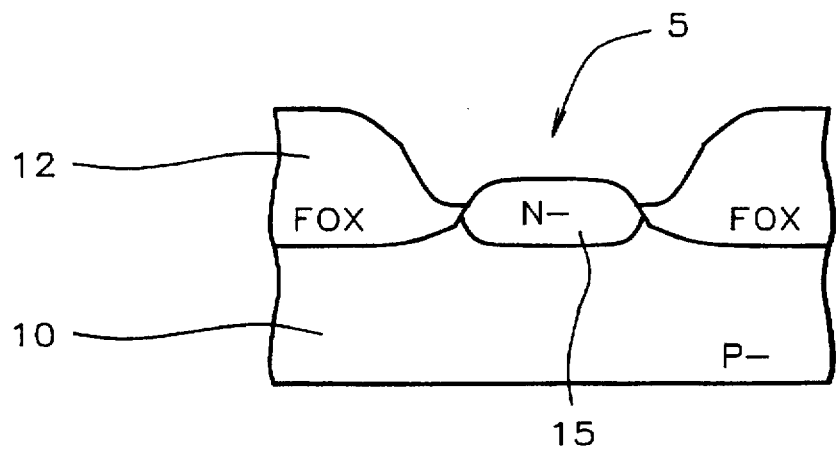

Referring now to FIG. 9, three of the totally self-aligned capacitor node contacts 5 are shown after the contact opening 9 is etched and the photoresist layer 22 is removed. Unlike the contact openings 9 of the prior art (FIG. 1) which must be critically aligned within the device areas, the alignment for the contact openings 9 of this invention is non-critical, and indeed can be opened over several self-aligned contacts 5, as depicted in FIG. 9. An enlarged cross sectional view of one of these totally self-aligned contacts 5 is shown in FIG. 11 prior to etching the opening 9 and is shown in FIG. 12 after the contact opening 9 is etched. Also indicated in FIG. 11 is the original width W of the patterned silicon nitride mask and the encroachment of the bird's beak L'. As is seen the resulting self-aligned contact 5 is therefore $N=W-2L'$ and for the example given above where W is 0.40 um and L' is 0.15 um the resulting contact is 0.10 um in width. Also shown in FIG. 11, depicted by the dashed line 40, is an over etch which removes a portion of the field oxide 12 and results in a final contact, as shown in FIG. 12. For example, if the over etch removes 500 Angstroms (0.05 um) of field oxide, then the contact width is further increased in size by 0.05 um on each side and the width of the contact is 0.20 um. The over etch insures that the contact is open and further allows one to alter the contact size.

Figure 13:
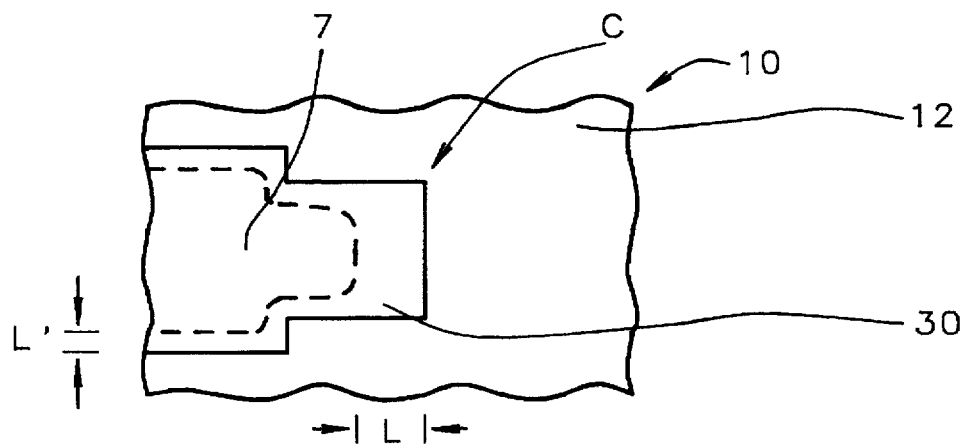
FIG. 13 is a schematic cross sectional view of a bird's beak formed near an exterior edge of the silicon nitride layer during the LOCOS processing having an enhanced bird's beak encroachment.
Figure 14:
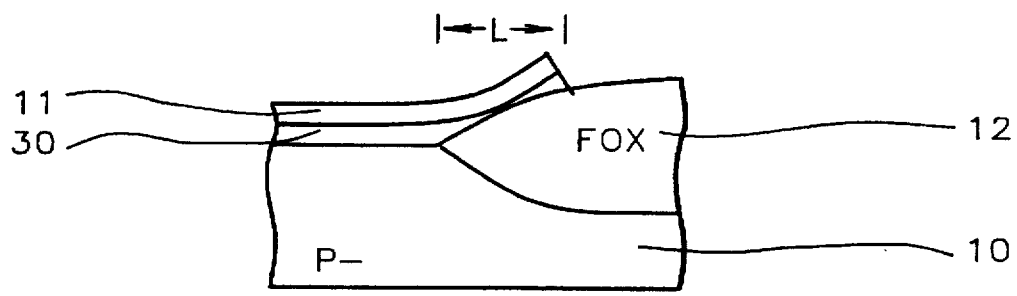
FIG. 14 is an elevational view depicting the shape of the contact in the device area having the enhanced bird's beak encroachment under the edge of the silicon nitride layer.
Figure 15:
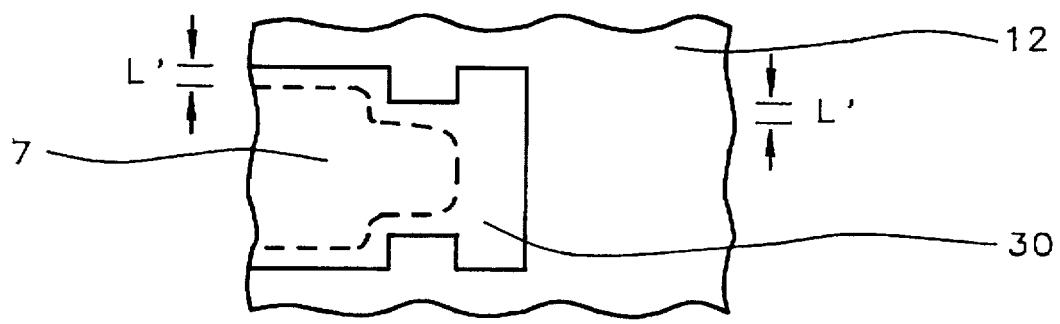
FIG. 15 is an elevational view of an improved contact in the narrow contact region using a "dog bone" shaped silicon nitride layer.

Referring now more specifically to FIGS. 13 through 16, an alternative method of forming the totally self-aligned contacts is describe which improves further the method of this invention. As shown in FIG. 13, when the field oxide 12 is grown by the LOCOS method on the substrate 10 an enhanced bird's beak encroachment naturally occurs at the exterior corners of the patterned silicon nitride layer 30 as indicated by the label C in FIG. 13. This results in a less desirable rounded contact in the narrow region of the device area 7 where the totally self-aligned contact is formed. A cross section of the bird's beak having this enhanced encroachment of length L is shown in FIG. 14. An alternative method which improves on the above contact is to pattern the silicon nitride layer 30 to have a "dog bone" type shape, as shown in FIG. 15, and by chosing the appropriately dimensions an essentially square or rectangular shaped contact can be formed, as depicted in FIG. 15. This results in a bird's beak having length L' as shown ing FIG. 16 which is shorter than the enhanced bird's beak encroachment of L.

Figure 10:
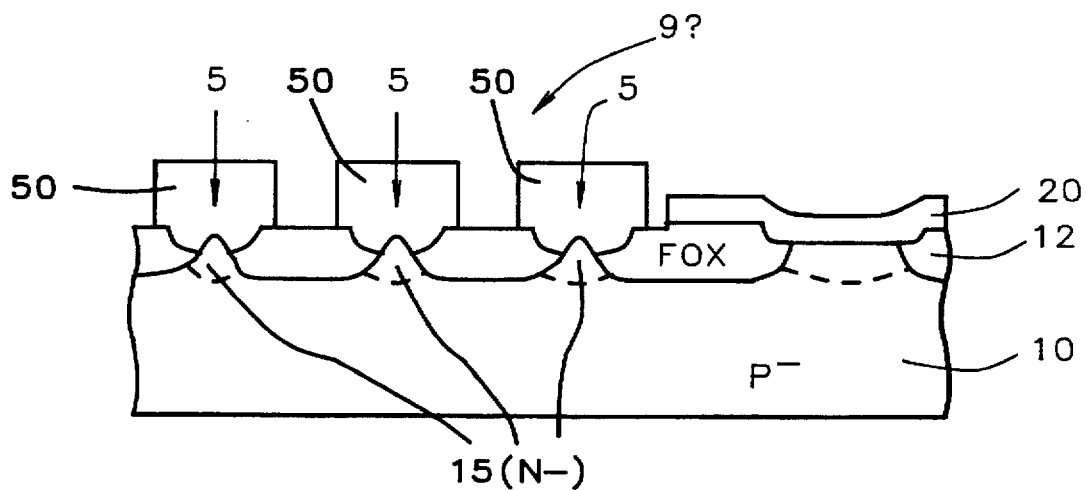

This completes the method of this invention for forming the totally self-aligned contacts 5, as shown in FIG. 9, but for completeness, the next step of forming the storage nodes 50 are depicted in FIG. 10. Typically the storage nodes 50 are composed of stacked storage capacitors. A simple conventional stacked capacitor can be fabricated by simply depositing two electrically conducting layers having an interposing thin dielectric layer and then patterning the layers to form the stacked capacitors. Alternatively, more advanced capacitor structures can be formed to increase the capacitance, such as multi fin-shaped, vertical walled structures and the like.

While the invention has been particularly shown and described with reference to the preferred embodiments thereof, it will be understood by those skilled in the art that various changes in form and details may be made without departing from the spirit and scope of the invention. For example, although the method of the invention was described for making the node contacts on DRAM cells, the totally self-aligned contacts can be made concurrently elsewhere on the chip for other semiconductor devices, and in particularly can be used to make the bit line contacts.

What is claimed is:

1. A method for fabricating totally self-aligned contacts on a semiconductor substrate having device areas with field effect transistors formed therein, comprising the steps of:

depositing on said semiconductor substrate a pad oxide;

depositing on said pad oxide a silicon nitride layer;

patterning by photoresist masking and anisotropic etching said silicon nitride layer leaving portions over said planned device areas, said patterned silicon nitride layer having wide portions in areas for field effect transistor gate electrodes and narrow portions over planned source/drain areas where said totally self-aligned contacts are to be formed;

thermally oxidizing said substrate in areas free of said silicon nitride by the method of local oxidation of silicon (LOCOS), and thereby forming field oxide areas around said device areas, said thermal oxide also extending laterally under the perimeter of said silicon nitride layer and forming bird's beak oxide structures that further reduce said device areas;

removing said patterned silicon nitride layer and said pad oxide layer, and thereby exposing the surface of said device areas;

forming a gate oxide on said device areas by thermal oxidation;

depositing a polysilicon layer;

depositing a first insulating layer on said polysilicon layer;

patterning said first insulating layer and said polysilicon layer, and thereby forming gate electrodes having thereon a cap oxide layer;

forming source/drain areas in said device areas adjacent to said gate electrodes by implantation;

depositing a blanket conformal sidewall insulating layer; and anisotropically etching back said sidewall layer, and thereby forming sidewall spacers on said gate electrodes;

depositing a conformal second insulating layer on said device areas and elsewhere on said substrate;

etching contact openings, by photoresist masking and anisotropic etching, in said second insulating layer over said narrow portions of said device areas, said contact openings extending over said field oxide bird's beak areas and over portions of said gate electrodes; and partially etching into said field oxide areas, and thereby removing a portion of said bird's beak oxide adjacent to said contact openings;

removing said photoresist masking, and thereby completing said totally self-aligned contact openings to said source/drain areas.

2. The method of claim 1, wherein said pad oxide is silicon oxide and is between about 50 to 400 Angstroms thick.

3. The method of claim 1, wherein the thickness of said silicon nitride ($Si_3N_4$) layer is between about 1000 to 3000 Angstroms.

4. The method of claim 1, wherein said wide portions of said silicon nitride layer is between about 0.5 to 0.8 micrometers 15 in width.

5. The method of claim 1, wherein said field oxide areas formed by said local oxidation of silicon (LOCOS) is between about 3000 to 7000 Angstroms thick.

6. The method of claim 5, wherein said field oxide formed by said LOCOS has a bird's beak structure extending under the perimeter of said patterned silicon nitride layer by a distance of between about 0.08 to 0.16 micrometers.

7. The method of claim 6, wherein the surface of said birds beak structure under said silicon nitride has an angle with respect to said semiconductor substrate surface of between about 40 to 50 degrees.

8. The method of claim 1, wherein said polysilicon layer is between about 1000 to 3000 Angstroms thick and is doped $N^+$ with a N-type dopant.

9. The method of claim 1, wherein the thickness of said first insulating layer is between about 1000 to 2000 Angstroms.

10. The method of claim 1, wherein said second insulating layer is composed of silicon oxide, and said second insulating layer is between about 900 to 1200 Angstroms thick.

11. The method of claim 1, wherein said sidewall spacers and said bird's beak oxide structures form the perimeter of a totally self-aligned contact, and the width of said totally self-aligned contact is less than the photolithographic resolution limit of said photo-resist.

12. A method for fabricating totally self-aligned node contacts for dynamic random access memory cells on a semiconductor substrate having device areas with field effect transistors formed therein, comprising the steps of:

depositing on said semiconductor substrate a pad oxide;

depositing on said pad oxide a silicon nitride layer;

patterning by photoresist masking and anisotropic etching said silicon nitride layer leaving portions over said planned device areas, said patterned silicon nitride layer having wide portions in areas for field effect transistor gate electrodes and narrow portions over planned node source/drain areas for making said totally self-aligned node contacts for said dynamic random access memory cells;

thermally oxidizing said substrate in areas free of said silicon nitride by the method of local oxidation of silicon (LOCOS), and thereby forming field oxide areas around said device areas, said thermal oxide also extending laterally under the perimeter of said silicon nitride layer and forming bird's beak oxide structures that further reduce said device areas;

removing said patterned silicon nitride layer and said pad oxide layer, and thereby exposing the surface of said device areas;

forming a gate oxide on said device areas by thermal oxidation;

depositing a polysilicon layer;

depositing a first insulating layer on said first polysilicon layer;

patterning said first insulating layer and said polysilicon layer, and thereby forming gate electrodes having thereon a cap oxide layer;

forming source/drain areas in said device areas adjacent to said gate electrodes by implantation;

depositing a blanket conformal sidewall insulating layer; and anisotropically etching back said sidewall layer, and thereby forming sidewall spacers on said gate electrodes;

depositing a conformal second insulating layer on said device areas and elsewhere on said substrate;

etching node contact openings, by photoresist masking and anisotropic etching, in said second insulating layer over the narrow portions of said device areas, said contact opening extending over said field oxide bird's beak areas and over portions of said gate electrodes; and partially etching into said field oxide areas, and thereby removing a portion of said bird's beak oxide adjacent to said contact openings;

removing said photoresist masking, and thereby completing said totally self-aligned node contact openings to said source/drain areas for said dynamic random access memory cells.

13. The method of claim 12, wherein said pad oxide is silicon oxide and is between about 50 to 400 Angstroms thick.

14. The method of claim 12, wherein the thickness of said silicon nitride ($Si_3N_4$) layer is between about 1000 to 3000 Angstroms.

15. The method of claim 12, wherein said wide portion of said silicon nitride layer is between about 0.5 to 0.8 micrometers in width.

16. The method of claim 12, wherein said field oxide areas formed by the local oxidation of silicon (LOCOS) is between about 3000 to 7000 Angstroms thick.

17. The method of claim 16, wherein said field oxide formed by said LOCOS has a bird's beak structure extending under the perimeter of said patterned silicon nitride layer by a distance of between about 0.08 to 0.16 micrometers.

18. The method of claim 17, wherein the surface of said birds beak structure under said silicon nitride has an angle with respect to said semiconductor substrate surface of between about 40 to 50 degrees.

19. The method of claim 12, wherein said polysilicon layer is between about 1000 to 3000 Angstroms thick and is doped $N^+$ with a N-type dopant.

20. The method of claim 12, wherein the thickness of said first insulating layer is between about 1000 to 2000 Angstroms, and said first insulating layer is deposited by chemical vapor deposition (CVD).

21. The method of claim 12, wherein said second insulating layer is composed of silicon oxide and said second insulating layer has a thickness of between about 900 to 1200 Angstroms.

22. The method of claim 12, wherein said sidewall spacers and said bird's beak oxide structures form the perimeter of a totally self-aligned contact, and the width of said totally self-aligned contact is less than the photolithographic resolution limit of said photoresist.

* * * * *

UNITED STATES PATENT AND TRADEMARK OFFICE
CERTIFICATE OF CORRECTION

PATENT NO. : 5,665,623
DATED : 9/9/97
INVENTOR(S) : Wen Jya Liang, Chan-Jen Kuo, Chao Ming Koh It is certified that error appears in the above-indentified patent and that said Letters Patent is hereby corrected as shown below: Title page:

Item (75) correct Inventor's name from "Chan-Jen Kno" to --Chan-Jen Kuo--

Signed and Sealed this

Ninth Day of December, 1997

Attest:

BRUCE LEHMAN

Attesting Officer

*Commissioner of Patents and Trademarks*